(12) United States Patent
Hung et al.

(10) Patent No.: US 8,018,147 B2
(45) Date of Patent: Sep. 13, 2011

(54) DUAL DISPLAY APPARATUS HAVING BUFFER LAYER

(75) Inventors: Min-Ling Hung, Hsin-Chu (TW); Hsiang-Chiu Wu, Hsin-Chu (TW); Chun-Yi Chiu, Hsin-Chu (TW); Min-Chieh Hu, Hsin-Chu (TW)

(73) Assignee: Au Optronics Corporation, Hsin-chu (TW)

( * ) Notice: Subject to any disclaimer, the term of this patent is extended or adjusted under 35 U.S.C. 154(b) by 548 days.

(21) Appl. No.: 11/826,200

(22) Filed: Jul. 12, 2007

(65) Prior Publication Data
US 2008/0012478 A1    Jan. 17, 2008

(30) Foreign Application Priority Data
Jul. 12, 2006 (TW) .............................. 95125547 A

(51) Int. Cl.
H01T 13/46 (2006.01)
H01J 63/04 (2006.01)
H01J 1/62 (2006.01)

(52) U.S. Cl. ........ 313/506; 313/507; 313/508; 313/512; 313/498; 315/169.4; 445/24; 445/25

(58) Field of Classification Search .......... 313/498–512; 315/169.1, 169.3; 428/690–691, 917; 438/26–29, 438/34, 82; 257/40, 72, 98, 100, 642–643, 257/759; 427/58, 64, 66, 532–535, 539; 445/24–25
See application file for complete search history.

(56) References Cited

U.S. PATENT DOCUMENTS

| | | | |
|---|---|---|---|
| 6,114,715 A | 9/2000 | Hamada et al. | |
| 6,351,066 B1 | 2/2002 | Gyoutoku et al. | |
| 6,515,428 B1 | 2/2003 | Yeh et al. | |
| 6,819,380 B2 | 11/2004 | Wen et al. | |
| 6,850,005 B2 | 2/2005 | Yoneda et al. | |
| 6,861,669 B2 | 3/2005 | Tan et al. | |
| 6,930,449 B2 | 8/2005 | Sasatani et al. | |
| 2004/0081852 A1* | 4/2004 | Chen et al. ................... | 428/690 |
| 2005/0052342 A1* | 3/2005 | Wu et al. ............................ | 345/4 |
| 2005/0269926 A1* | 12/2005 | Fukuoka et al. ............... | 313/123 |
| 2005/0285513 A1* | 12/2005 | Choi et al. .................... | 313/504 |

FOREIGN PATENT DOCUMENTS

| | | |
|---|---|---|
| CN | 1652646 A | 8/2005 |
| CN | 1674738 A | 9/2005 |
| EP | 1437778 | 7/2004 |
| JP | 2005-190934 | 7/2005 |

(Continued)

Primary Examiner — Anne Hines
Assistant Examiner — Tracie Green
(74) Attorney, Agent, or Firm — Jianq Chyun IP Office

(57) ABSTRACT

A double-faced display apparatus includes a first transparent substrate, second transparent substrate, frame adhesive, first OELD, second OELD, first buffer layer, second buffer layer, first absorbent layer and second absorbent layer. The second transparent substrate is disposed in parallel to the first transparent substrate. The frame adhesive is disposed between the first transparent substrate and second transparent substrate for defining a space. The first OELD is disposed in the space and located on the first transparent substrate. The second OELD is disposed in the space and located on the second transparent substrate. The first buffer layer is disposed in the space and covers the first OELD. The second buffer layer is disposed in the space and covering the second OELD. The first absorbent layer is disposed in the space and covers the first buffer layer. The second absorbent layer is disposed in the space and covers the second buffer layer.

24 Claims, 4 Drawing Sheets

FOREIGN PATENT DOCUMENTS

| | | |
|---|---|---|
| JP | 2005-235403 | 9/2005 |
| JP | 2005-259432 | 9/2005 |
| TW | 499596 | 8/2002 |
| TW | 556315 | 10/2003 |
| TW | 586096 | 5/2004 |
| TW | 595260 | 6/2004 |
| TW | I223784 | 11/2004 |
| TW | I228384 | 2/2005 |
| TW | I230294 | 4/2005 |
| TW | 200604670 | 2/2006 |

\* cited by examiner

DUAL DISPLAY APPARATUS HAVING BUFFER LAYER

This application claims the benefit of Taiwan Patent Application Serial No. 95125547, filed Jul. 12, 2006, the subject matter of which is incorporated herein by reference.

BACKGROUND OF THE INVENTION

1. Field of the Invention

The invention relates in general to a display apparatus, and more particularly to a double-faced display apparatus.

2. Description of the Related Art

Compared to other flat-panel-display technologies, the organic electroluminescence device (OELD) has many advantages over today's liquid crystal display (LCD) or plasma display due to its excellent features, such as self-illumination, high brightness, large view-angles, high contrast, low power consumption, high-speed response, large range of operational temperature, and simple manufacturing process. In general, the conventional OELD employs a multiple-layer structure, and an organic light-emitting layer used for light emission is disposed between an anode layer and a cathode layer. A hole injection layer (HIL) and a hole transporting layer (HTL) are formed between the organic light-emitting layer and the anode layer; an electron transporting layer (ETL) is formed between the organic light-emitting layer and the cathode layer. Such a multi-layer structure is good for electrons injected from the cathode to flow toward the anode. The organic light-emitting layer can be divided into two classes in terms of the materials. One class is a small-molecular light-emitting diode primarily made of dyes or colors, which is called an organic light-emitting diode (OLED) or OELD. The other class is primarily made of polymer materials, which is called a polymer light-emitting diode (PLED) or light-emitting polymer device (LEPD).

The common method for manufacturing a double-faced display apparatus is to combine two single-faced display apparatuses. Referring to FIG. 1, a cross-sectional diagram of a conventional double-faced display apparatus is shown. A double-faced display apparatus 10 includes two single-faced display apparatuses 11, and each single-faced display apparatus 11 includes a glass substrate 12, a back cover 13, an OELD 15 and a drying agent 16. The back cover 13 is attached on the glass substrate 12 with its opening faced to the glass substrate 12 to form a sealed space. The OELD 15 is disposed in the sealed space 14 and located on the glass substrate 12. The drying agent 16 is disposed in the sealed space 14 and partially covers the OELD 15.

In the fabrication of the double-faced display apparatus 10, the two single-faced display apparatuses 11 are fabricated individually and then combined back to back. That is, the back covers 13 of the upper and lower single-faced display apparatuses 11 are face-to-face touched and attached to each other to fabricate the above-mentioned double-faced display apparatus 10.

However, the double-faced display apparatus 10 formed by the fabrication of the two single-faced display apparatuses 11 has larger thickness and weight, and thus higher cost.

Besides, the drying agent 16 absorbing water would lead to the increase of weight and volume of the display apparatus 11, and the deformed drying agent 16 with an increasing weight will press the OELD 15 to break, thereby greatly influencing the quality of the double-faced display apparatus 10.

SUMMARY OF THE INVENTION

It is therefore an object of the invention to provide a double-faced display apparatus. Compared to a conventional double-faced display apparatus, the double-faced display apparatus of the invention is not composed of two single-faced display apparatuses and can have smaller thickness and weight and lower production cost. Besides, a buffer layer with buffer and shockproof effects is formed between an absorbent layer and an OELD to prevent the absorbent layer in expansion from damaging the OELD. Therefore, the quality of the double-faced display apparatus can be improved.

The invention achieves the above-identified object by providing a double-faced display apparatus including a first transparent substrate, a second transparent substrate, a frame adhesive, a first OELD, a second OELD, a first buffer layer, a second buffer layer, a first absorbent layer and a second absorbent layer. The second transparent substrate is disposed in parallel to the first transparent substrate. The frame adhesive is disposed between the first transparent substrate and the second transparent substrate for defining a space. The first OELD is disposed in the space and located on the first transparent substrate. The second OELD is disposed in the space and located on the second transparent substrate. The first buffer layer is disposed in the space and covers the first OELD. The second buffer layer is disposed in the space and covering the second OELD. The first absorbent layer is disposed in the space and covers the first buffer layer. The second absorbent layer is disposed in the space and covers the second buffer layer.

Other objects, features, and advantages of the invention will become apparent from the following detailed description of the preferred but non-limiting embodiments. The following description is made with reference to the accompanying drawings.

DETAILED DESCRIPTION OF THE INVENTION

Embodiment One

Figure 1:
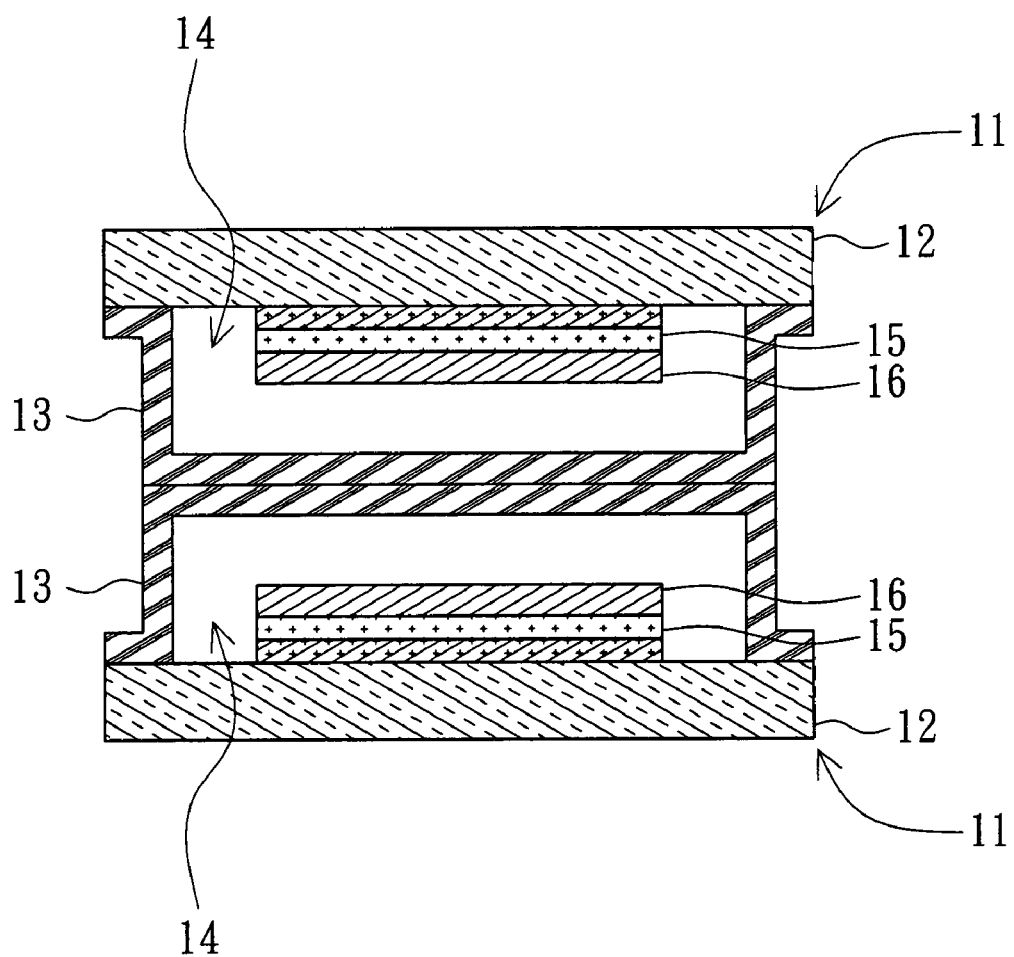
FIG. 1 (Related Art) is a cross-sectional diagram of a conventional double-faced display apparatus.
Figure 2A:
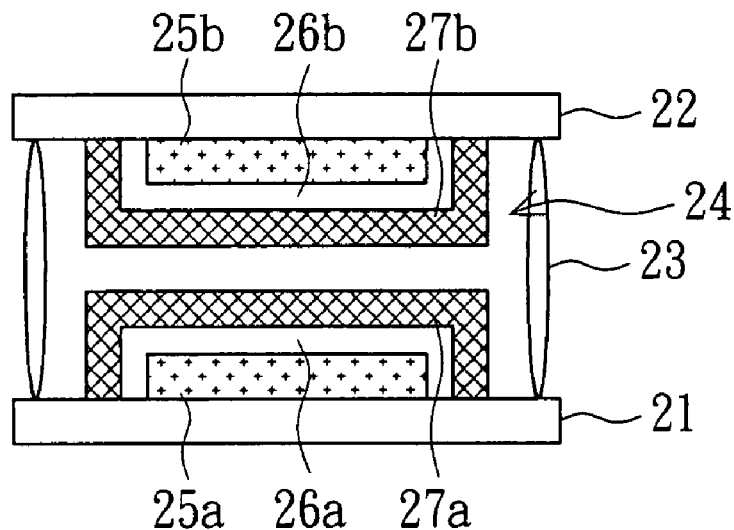
FIG. 2A is a cross-sectional diagram of a double-faced display apparatus with a first absorbent layer and a second absorbent layer separated from each other according to the first embodiment of the invention.

Referring to FIG. 2A, a cross-sectional diagram of a double-faced display apparatus according to the first embodiment of the invention is shown. As shown in FIG. 2A, a double-faced display apparatus 20 includes a first transparent substrate 21, a second transparent substrate 22, a frame adhesive 23, a first OELD 25a, a second OELD 25b, a first buffer layer 26a, a second buffer layer 26b, a first absorbent layer 27a, and a second absorbent layer 27b. The second transparent substrate 22 and the first transparent substrate 21 are disposed in parallel and separated from each other. The frame adhesive 23 is disposed between the first transparent substrate 21 and the second transparent substrate 22 to define a space 24. The first OELD 25a is disposed in the space 24 and located on the first transparent substrate 21. The second OELD 25b is disposed in the space 24 and located on the second transparent substrate 22. The first buffer layer 26a is disposed in the space 24 and covers the first OELD 25a, and the second buffer layer 26b is disposed in the space 24 and covers the second OELD, 25a. The first absorbent layer 27a is disposed in the space 24 and covers the first buffer layer 26a. The second absorbent layer 27b is disposed in the space 24 and covers the second, buffer layer 26b.

Besides, the amount of water absorbed by the first absorbent layer 27a and the second absorbent layer 27b is determined by their thickness. If the first absorbent layer 27a and the second absorbent layer 27b have too small thickness, the first and second OELDs 25a and 25b will be damaged by water due to the insufficient water-absorption effect of the first absorbent layer 27a and the second absorbent layer 27b. Contrarily, if the first absorbent layer 27a and the second absorbent layer 27b have too large thickness, it is easy that the first absorbent layer 27a and the second absorbent layer 27b will respectively peel from the first buffer layer 26a and the second buffer layer 26b, thereby causing a structure damage of the double-faced display apparatus 20. Therefore, in the embodiment, the first absorbent layer 27a and the second absorbent layer 27b both have thickness of 0.3 um~3 um preferably to maintain a better water-absorption effect and not to peel from the first buffer layer 26a and the second buffer layer 26b. The first absorbent layer 27a and the second absorbent layer 27b can have the same thickness or different thickness. The first absorbent layer 27a and the second absorbent layer 27b respectively cover the first buffer layer 26a and the second buffer layer 26b completely.

Besides, the first absorbent layer 27a and the second absorbent layer 27b can be made of any absorbent material. The first absorbent layer 27a or the second absorbent layer 27b can include active metal or active metal alloy, such as calcium, strontium, barium, or their alloy. Furthermore, the first absorbent layer 27a or the second absorbent layer 27b can include metal oxide or metal sulfide, such as calcium oxide, strontium oxide, barium oxide, barium sulfide, strontium sulfide, calcium sulfide, or their combination.

In addition, the first buffer layer 26a and the second buffer layer 26b are made of organic material or inorganic material. The first buffer layer 26a and the second buffer layer 26b can be made of the same material or different materials. The first buffer layer 26a and the second buffer layer 26b respectively cover the first OELD 25a and the second OELD 25b completely. The first transparent substrate 21 or the second transparent substrate 22 can be a glass substrate, a plastic substrate, an insulation substrate, or a flexible substrate.

Figure 2B:
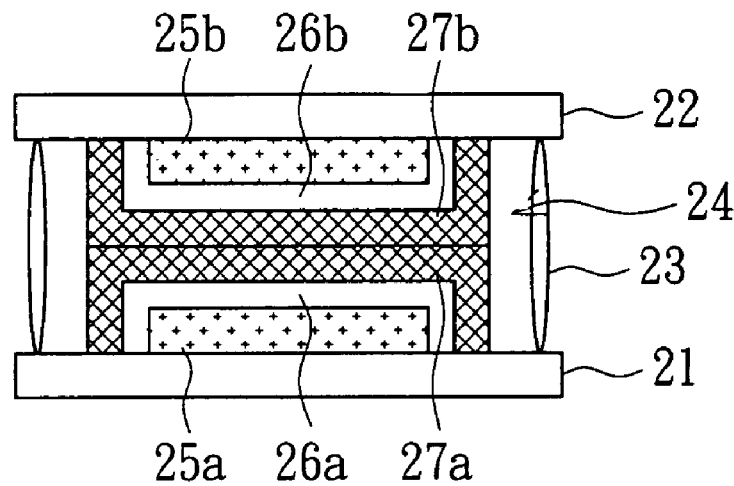
FIG. 2B is a cross-sectional diagram of a double-faced display apparatus with a first absorbent layer and a second absorbent layer manufactured into a unity according to the first embodiment of the invention.

Any one skilled in the related art will realize that the skill of the embodiment is not limited thereto. For example, in the embodiment, although the first absorbent layer 27a and the second absorbent layer 27b are exemplified to be separated from each other, the first absorbent layer 27a and the second absorbent layer 27b can also be manufactured into a unity as shown in FIG. 2B. Moreover, each of the first OELD 25a and the second OELD 25b includes an anode, an organic light-emitting layer and a cathode. A hole source, such as a hole transmission layer or an electron injection layer, is generated between the anode and organic light-emitting layer. An electron source, such as an electron transmission layer or an electron injection layer, is generated between the cathode and organic light emitting layer. The organic light-emitting layer can be divided into two classes in terms of material. One class is a small-molecular organic light-emitting diode primarily made of dyes or colors, which is called OLED or OELD. The other class is primarily made of polymer, which is called PLED or LEPD. The organic light-emitting layer is exemplified to be the first OELD 25a and the second OELD 25b in the embodiment. Besides, the first OELD 25a and the second OELD 25b can be active or passive devices. The double-faced display apparatus 25 can display the same images or different images at two faces according to design of a driving circuit.

Unlike the conventional double-faced display apparatus, the double-faced display apparatus of the embodiment is not composed of two single-faced display apparatuses, and can have smaller thickness and weight, and lower production cost.

The buffer layer disposed between the absorbent layer and OELD in the embodiment has a shockproof effect and can reduce the damage of the OELD due to expansion of the absorbent layer, thereby improving the quality of the double-faced display apparatus.

Embodiment Two

Figure 3:
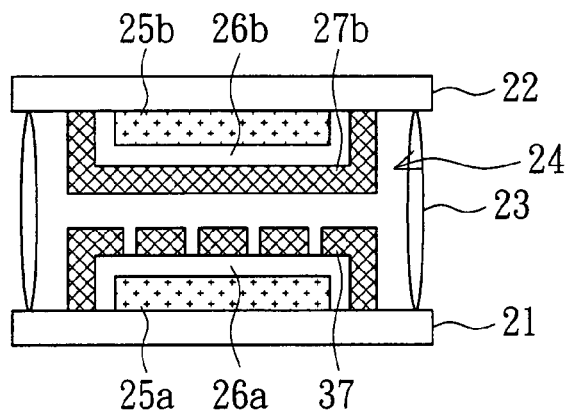
FIG. 3 is a cross-sectional diagram of a double-faced display apparatus according to the second embodiment of the invention.

Referring to FIG. 3, a cross-sectional diagram of a double-faced display apparatus according to the second embodiment of the invention is shown. The double-faced display apparatus 30 is different from the double-faced display apparatus 20 only in the first absorbent layer 37, and uses the same symbols for the same layers as in the double-faced display apparatus 20, whose detail is not necessary to be given here.

As shown in FIG. 3, the first absorbent layer 37 partially covers the first buffer layer 26a. The first absorbent layer 37 includes active metal or active metal alloy such as calcium, strontium, barium, or their alloy. Furthermore, the first absorbent layer 37 includes metal oxide or metal sulfide such as calcium oxide, strontium oxide, barium oxide, barium sulfide, strontium sulfide, calcium sulfide, or their combination. The first absorbent layer 37 has thickness of 0.3 um~3 um preferably.

Embodiment Three

Figure 4:
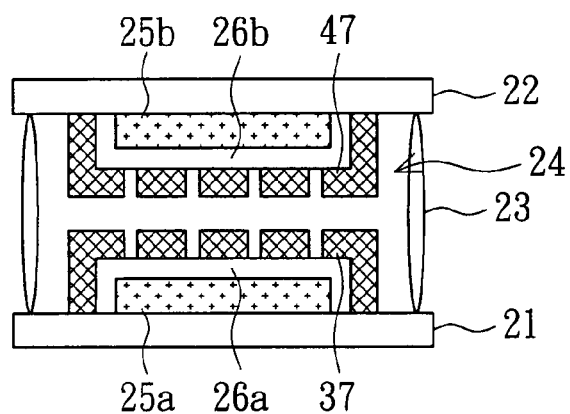
FIG. 4 is a cross-sectional diagram of a double-faced display apparatus according to the third embodiment of the invention.

Referring to FIG. 4, a cross-sectional diagram of a double-faced display apparatus according to the third embodiment of the invention is shown. The double-faced display apparatus 40 is different from the double-faced display apparatus 30 only in the second absorbent layer 47, and uses the same symbols for the same layers as in the double-faced display apparatus 30, whose detail is not necessary to be given here.

As shown in FIG. 4, the second absorbent layer 47 partially covers the second buffer layer 26b. The second absorbent layer 47 includes active metal or active metal alloy such as calcium, strontium, barium, or their alloy. Furthermore, the second absorbent layer 47 includes metal oxide or metal sulfide such as calcium oxide, strontium oxide, barium oxide, barium sulfide, strontium sulfide, calcium sulfide, or their combination. The second absorbent layer 47 has thickness of 0.3 um~3 um preferably.

Embodiment Four

Figure 5:
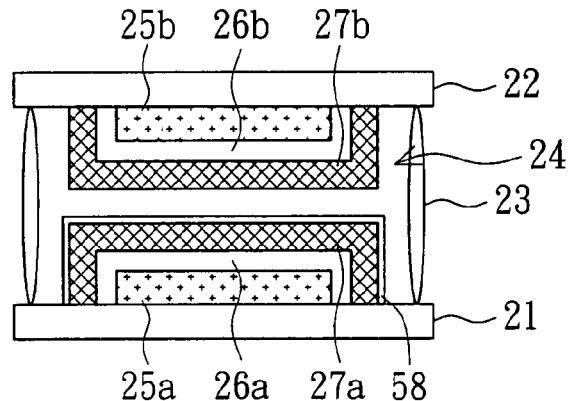
FIG. 5 is a cross-sectional diagram of a double-faced display apparatus according to the fourth embodiment of the invention.

Referring to FIG. 5, a cross-sectional diagram of a double-faced display apparatus according to the fourth embodiment of the invention is shown. The double-faced display apparatus 50 is different from the double-faced display apparatus 20 by including an extra first inorganic material layer 58, and uses the same symbols for the same layers as in the double-faced display apparatus 20, whose detail is not necessary to be given here.

As shown in FIG. 5, the first inorganic material layer 58 is disposed in the space 24 and covers the first absorbent layer 27a. The first inorganic material layer 58 can completely or partially cover the first absorbent layer 27a. If the absorbent layer 27a partially covers the first buffer layer 26a, the first inorganic material layer 58 can also cover a part of the first buffer layer 26a by penetrating the first absorbent layer 27a.

Embodiment Five

Figure 6A:
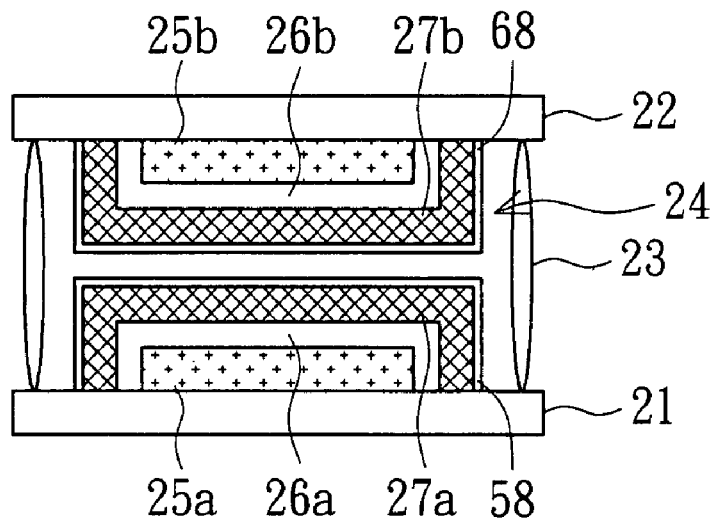
FIG. 6A is a cross-sectional diagram of a double-faced display apparatus with a first organic material layer and a second organic material layer separated from each other according to the fifth embodiment of the invention.

Referring to FIG. 6A, a cross-sectional diagram of a double-faced display apparatus according to the fifth embodiment of the invention is shown. The double-faced display apparatus 60 is different from the double-faced display apparatus 50 by including an extra second inorganic material layer 68, and uses the same symbols for the same layers as in the double-faced display apparatus 50, whose detail is not necessary to be given here.

As shown in FIG. 6A, the second inorganic material layer 68 is disposed in the space 24 and covers the second absorbent layer 27b. The second inorganic material layer 68 can completely or partially cover the second absorbent layer 27b. If the second absorbent layer 27b partially covers the second buffer layer 26b, the second inorganic material layer 68 can also cover a part of the second buffer layer 26b by penetrating the second absorbent layer 27b.

Figure 6B:
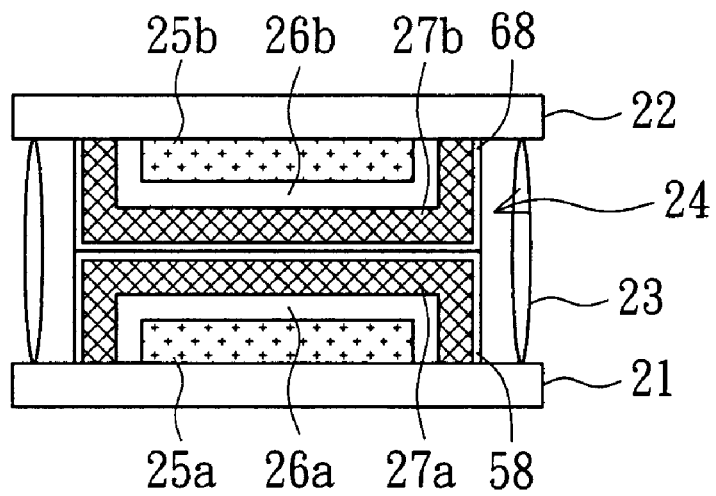
FIG. 6B is a cross-sectional diagram of a double-faced display apparatus with a first organic material layer and a second organic material layer manufactured into a unity according to the fifth embodiment of the invention.

Any one skilled in the related art will realize that the skill of the embodiment is not limited thereto. For example, the first inorganic material layer 58 and the second inorganic material layer 68 can be made of the same or different materials. Moreover, the first inorganic material layer 58 and the second inorganic material layer 68 can have the same thickness or different thickness. The first inorganic material layer 58 and the second inorganic material layer 68 can be separated from each other as shown in FIG. 6A or manufactured into a unity as shown in FIG. 6B.

The double-faced display apparatus disclosed by the above-mentioned embodiment of the invention is not composed of two single-faced display apparatuses and has smaller thickness and weight and lower production cost as compared to the conventional double-faced display apparatus. Besides, the buffer layer disposed between the absorbent layer and OELD has buffer and shockproof effects, which helps to reduce the damage of the OELD due to the expansion of the absorbent layer. Therefore, the quality of the double-faced display apparatus can be greatly improved.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A dual display apparatus, comprising:
   a first transparent substrate;
   a second transparent substrate, disposed in parallel to the first transparent substrate;
   a frame adhesive, disposed between the first transparent substrate and the second transparent substrate for defining a space;
   a first organic electroluminescence device (OELD), disposed in the space and located on the first transparent substrate;
   a second OELD, disposed in the space and located on the second transparent substrate;
   a first buffer layer, disposed in the space and covering the first OELD;
   a second buffer layer, disposed in the space and covering the second OELD;
   a first absorbent layer, disposed in the space and only partially covering the first buffer layer; and
   a second absorbent layer, disposed in the space and covering the second buffer layer.

2. The apparatus according to claim 1, wherein the first absorbent layer and the second absorbent layer both have a thickness of 0.3 um.about.3 um.

3. The apparatus according to claim 2, wherein the first absorbent layer and the second absorbent layer have the same thickness.

4. The apparatus according to claim 1, wherein the first absorbent layer and the second absorbent layer have different thickness.

5. The apparatus according to claim 1, wherein the first absorbent layer and the second absorbent layer include active metal or active metal alloy.

6. The apparatus according to claim 5, wherein the first absorbent layer and the second absorbent layer include calcium, strontium, barium or, their alloy.

7. The apparatus according to claim 1, wherein the first absorbent layer and the second absorbent layer include metal oxide or metal sulfide.

8. The apparatus according to claim 7, wherein the first absorbent layer and the second absorbent layer include calcium oxide, strontium oxide, barium oxide, strontium sulfide, barium sulfide, calcium sulfide, or their combination.

9. The apparatus according to claim 1, wherein the first absorbent layer is separated from the second absorbent layer.

10. The apparatus according to claim 1, wherein the first absorbent layer and the second absorbent layer are manufactured into a unity.

11. The apparatus according to claim 1, wherein the first absorbent layer and the second absorbent layer respectively cover the first OELD and the second OELD completely.

12. The apparatus according to claim 11, wherein the second absorbent layer only partially covers the second buffer layer.

13. The apparatus according to claim 1, further comprising:
   a first inorganic material layer, disposed in the space and covering the first absorbent layer.

14. The apparatus according to claim 13, further comprising:
   a second inorganic material layer, disposed in the space and covering the second absorbent layer.

15. The apparatus according to claim 14, wherein the first inorganic material layer and the second inorganic material layer are made of the same material.

16. The apparatus according to claim 14, wherein the first inorganic material layer and the second inorganic material layer are made of different materials.

17. The apparatus according to claim 14, wherein the first inorganic material layer and the second inorganic material layer have the same thickness.

18. The apparatus according to claim 14, wherein the first inorganic material layer and the second inorganic material layer have different thickness.

19. The apparatus according to claim 1, wherein each of the first buffer layer and the second buffer layer includes an organic material or inorganic material.

20. The apparatus according to claim 19, wherein the first buffer layer and the second buffer layer are made of the same material.

21. The apparatus, according to claim 19, wherein the first buffer layer and the second buffer layer are made of different materials.

22. The apparatus according to claim 19, wherein the first buffer layer and the second buffer layer have the same thickness.

23. The apparatus according to claim 19, wherein the first buffer layer and the second buffer layer have different thickness.

24. The apparatus according to claim 1, wherein each of the first transparent substrate and the second transparent substrate includes a glass substrate, a plastic substrate, an insulation substrate, or a flexible substrate.

* * * * *